(12) United States Patent
Ogawa et al.

(10) Patent No.: US 10,479,675 B2
(45) Date of Patent: Nov. 19, 2019

(54) METHOD OF PRODUCTION OF SEMICONDUCTOR DEVICE HAVING SEMICONDUCTOR LAYER AND SUPPORT SUBSTRATE SPACED APART BY RECESS

(71) Applicant: DENSO CORPORATION, Kariya, Aichi-pref. (JP)

(72) Inventors: Akira Ogawa, Kariya (JP); Yoshitaka Noda, Kariya (JP); Tetsuo Yoshioka, Kariya (JP); Yuhei Shimizu, Kariya (JP)

(73) Assignee: DENSO CORPORATION, Kariya (JP)

( * ) Notice: Subject to any disclaimer, the term of this patent is extended or adjusted under 35 U.S.C. 154(b) by 0 days.

(21) Appl. No.: 15/757,672

(22) PCT Filed: Sep. 9, 2016

(86) PCT No.: PCT/JP2016/076612
§ 371 (c)(1),
(2) Date: Mar. 6, 2018

(87) PCT Pub. No.: WO2017/056920
PCT Pub. Date: Apr. 6, 2017

(65) Prior Publication Data
US 2019/0023563 A1 Jan. 24, 2019

(30) Foreign Application Priority Data

Nov. 27, 2015 (JP) ................. 2015-232037

(51) Int. Cl.
*B81C 1/00* (2006.01)
*G01P 15/08* (2006.01)
*G01P 15/125* (2006.01)

(52) U.S. Cl.
CPC ...... *B81C 1/00579* (2013.01); *G01P 15/0802* (2013.01); *G01P 15/125* (2013.01);
(Continued)

(58) Field of Classification Search
None
See application file for complete search history.

(56) References Cited

U.S. PATENT DOCUMENTS 6,240,782 B1 * 6/2001 Kato ................... G01P 15/0802
361/280
7,067,344 B1 6/2006 Oguchi
(Continued)

FOREIGN PATENT DOCUMENTS

JP   H05-013378 A   1/1993
JP   H06-275564 A   9/1994
(Continued)

*Primary Examiner* — Andres Munoz
(74) *Attorney, Agent, or Firm* — Posz Law Group, PLC

(57) ABSTRACT

A semiconductor device production method includes performing trench etching to form a trench in a thickness direction of a semiconductor layer so that both of a first pattern portion and a second pattern portion whose side walls face each other across the trench are formed. In the trench etching, the semiconductor layer is etched and removed while a protective film is formed on a surface of the semiconductor layer, and the trench etching is performed so that the first pattern portion and the second pattern portion are configured to have a same potential or a same temperature during the trench etching.

7 Claims, 12 Drawing Sheets

(52) U.S. Cl.
CPC . *B81B 2201/033* (2013.01); *B81C 2201/0112* (2013.01); *B81C 2201/0132* (2013.01); *B81C 2201/0139* (2013.01); *B81C 2201/0142* (2013.01); *G01P 2015/0814* (2013.01); *G01P 2015/0882* (2013.01)

(56) References Cited

U.S. PATENT DOCUMENTS

| | | |
|---|---|---|
| 2004/0110318 A1 | 6/2004 | Oguchi |
| 2006/0110843 A1 | 5/2006 | Oguchi |
| 2007/0080136 A1 | 4/2007 | Takata et al. |
| 2007/0222011 A1* | 9/2007 | Robert ................ G01C 19/574 257/415 |
| 2008/0176409 A1 | 7/2008 | Takata et al. |
| 2008/0217613 A1* | 9/2008 | Oshida ............. H01L 21/76808 257/48 |
| 2009/0079026 A1 | 3/2009 | Zhu et al. |
| 2009/0183568 A1 | 7/2009 | Yamanaka et al. |
| 2009/0261430 A1* | 10/2009 | Suzuki ................... B81B 7/007 257/417 |
| 2010/0313660 A1 | 12/2010 | Nishikage et al. |
| 2011/0089503 A1* | 4/2011 | Fujita ................... B81B 3/0086 257/415 |
| 2012/0139064 A1* | 6/2012 | Nakatani ............. B81C 1/00182 257/415 |
| 2013/0313660 A1 | 11/2013 | Nakatani et al. |
| 2014/0322854 A1 | 10/2014 | Nakatani et al. |
| 2015/0143906 A1 | 5/2015 | Ogawa |
| 2017/0192033 A1* | 7/2017 | Yoshida ................ G01P 15/125 |

FOREIGN PATENT DOCUMENTS

| | | |
|---|---|---|
| JP | H07-147270 A | 6/1995 |
| JP | 2002-318244 A | 10/2002 |
| JP | 2006-220672 A | 8/2006 |

* cited by examiner

METHOD OF PRODUCTION OF SEMICONDUCTOR DEVICE HAVING SEMICONDUCTOR LAYER AND SUPPORT SUBSTRATE SPACED APART BY RECESS

CROSS REFERENCE TO RELATED APPLICATIONS

This application is a U.S. national stage application of International Application No. PCT/JP2016/076612 filed on Sep. 9, 2016 and is based on Japanese Patent Applications No. 2015-194499 filed on Sep. 30, 2015 and No. 2015-232037 filed on Nov. 27, 2015, the disclosures of which are incorporated herein by reference.

TECHNICAL FIELD

The present disclosure relates to a semiconductor device production method in which a first pattern portion and a second pattern portion, which are partitioned by a trench, are formed in a semiconductor layer.

BACKGROUND

As a production method of this type, a method has been proposed in which a trench etching for forming a trench in a thickness direction of a semiconductor layer is performed to form a first pattern portion and a second pattern portion whose mutual side walls face each other across the trench.

JP 2006-220672 A exemplifies an acceleration sensor and a method of manufacturing the acceleration sensor. In the acceleration sensor, one of the first pattern portion and the second pattern portion is a movable electrode, and the other of the first pattern portion and the second pattern portion is a fixed electrode. In this case, the trench etching is performed by etching and removing the semiconductor layer while a protective film is formed on a surface and side walls of the semiconductor layer.

SUMMARY

The side walls between those pattern portions are roughened during the trench etching described above. The present disclosure provides a semiconductor device production method capable of improving such roughness of the side walls or the like.

(First Aspect)

For example, in the trench etching as described above, both of the first pattern portion and the second pattern portion are charged by plasma or the like. At that time, a potential difference is generated between the two pattern portions due to a difference in shape or the like between the two pattern portions.

When such a potential difference occurs between the two pattern portions during the trench etching, a collision frequency of cations increases to thin the protective film on the side walls of the pattern portions charged to minus. For that reason, a difference occurs in the thickness of the protective films adhering to the side walls between the two pattern portions. When isotropic etching is performed on the side wall where the adhesion of the protective film is insufficient, drawbacks occur such that the side wall is roughened or a desired side wall shape is not obtained.

In JP 2006-220672 A, in order to prevent the movable electrode and the fixed electrode from being charged by plasma or the like at the time of trench etching, a metal wiring for setting the movable electrode and the fixed electrode to be equipotential is formed on the semiconductor layer of a wafer.

However, the metal wiring causes many restrictions such as occupation of a space by the metal wire on the semiconductor layer and time and labor for formation of the wire. For example, in the case of a WLP (wafer level package) or the like, the metal wiring on the semiconductor layer hinders and makes it difficult to join a silicon layer as a cap onto the semiconductor layer.

In a first aspect of the present disclosure, it is provided a semiconductor device production method which is capable of performing trench etching without the use of a metal wiring that electrically connects both of a first pattern portion and a second pattern portion while setting both of the pattern portions at the same potential.

A semiconductor device production method according to the first aspect of the present disclosure includes performing trench etching for forming a trench in a thickness direction of a semiconductor layer so that both of a first pattern portion and a second pattern portion whose side walls face each other across the trench are formed.

In the production method, the trench etching is performed by etching and removing the semiconductor layer while a protective film is formed on a surface of the semiconductor layer. In the production method, the trench etching is performed so that the first pattern portion and the second pattern portion have a structure in which the first pattern portion and the second pattern portion have the same potential during the trench etching.

An example of the semiconductor device production method according to the first aspect of the present disclosure includes performing the trench etching so that the first pattern portion and the second pattern portion, after the trench is formed, are connected to each other by a coupling portion as a portion of the semiconductor layer other than both the pattern portions, to thereby bring the first pattern portion and the second pattern portion into the same potential state during the trench etching.

According to the above method, during the trench etching, the first pattern portion and the second pattern portion are configured as the same continuous semiconductor layer including the coupling portion. Therefore, according to the present production method, the trench etching can be performed in a state where both the pattern portions have the same potential without the use of the metal wiring that electrically connects both the pattern portions to each other.

Another example of the semiconductor device production method according to the first aspect of the present disclosure includes performing trench etching for forming a trench in a thickness direction of a semiconductor layer, and forming both of one pattern portion and another pattern portion whose side walls face each other across the trench, and which are electrically isolated from each other after the trench is formed. In the present production method, the trench etching is performed so as to provide a structure in which a total area of a trench etching starting side surface and side walls of a third pattern portion is equal to a total area of a trench etching starting side surface and side walls of a fourth pattern portion. With the above method as well, the trench etching can be performed in a state where both the pattern portions have the same potential without the use of the metal wiring that electrically connects both the pattern portions to each other.

Still another example of the semiconductor device production method according to the first aspect of the present disclosure includes performing trench etching for forming a trench in a thickness direction of a semiconductor layer, and forming both of one pattern portion and another pattern portion whose side walls face each other across the trench, and which are electrically isolated from each other after the trench has been formed. In the present production method, both of a portion of the semiconductor layer forming the third pattern portion and the semiconductor layer forming the fourth pattern portion are joined to and supported on a support substrate through an insulating film at a portion other than an area where the trench is formed. In that state, trench etching of the third and fourth pattern portions is performed. Further, in the present production method, the trench etching is performed in a state where a joint surface area between the third pattern portion and the insulating film is equal to a joint surface area between the fourth pattern portion and the insulating film. With the above method as well, the trench etching can be performed in a state where both the pattern portions have the same potential without the use of the metal wiring that electrically connects both the pattern portions to each other.

(Second Aspect)

In the trench, a ratio of a depth to a width is taken as an aspect ratio. When the aspect ratio is increased to make the trench thinner and deeper, the side walls of both the pattern portions are excessively etched and thus roughened.

This is provoked because the supply of a gas such as $C_4F_8$ for forming the protective film for side wall protection and a gas such as $SF_6$ for performing isotropic etching becomes unbalanced toward the latter half of the trench etching, so that the etching proceeds while the side walls are unprotected.

Therefore, in JP 2007-103876 A, the trench etching is performed with the use of a special gas in which a gas containing hydrogen in a predetermined range is added to a mixed gas containing $SF_6$ and $O_2$, to thereby improve the aspect ratio of the trench.

On the other hand, according to the present inventors' study, factors of the side wall roughness include a temperature difference occurring between the first pattern portion and the second pattern portion due to heat generation associated with an etching reaction during the trench etching.

When such a temperature difference occurs between the two pattern portions during the trench etching, the protective film becomes thin or the protective film does not adhere to the side wall of the pattern portion on the higher temperature side. For that reason, a difference occurs in the thickness of the protective films adhering to the side walls between the two pattern portions.

When dry etching is performed on the side wall where the adhesion of the protective film is insufficient, drawbacks occur such that the side wall is roughened or a desired side wall shape is not obtained. The problem of the side wall roughness due to such a temperature difference is inevitable even when the special gas described above is used.

In a second aspect of the present disclosure, it is provided a semiconductor device production method capable of appropriately reducing roughness of side walls between a first pattern portion and a second pattern portion partitioned by trench etching.

A semiconductor device production method according to the second aspect of the present disclosure includes performing trench etching for forming a trench in a thickness direction of a semiconductor substrate, and forming both of a first pattern portion and a second pattern portion whose side walls face each other across the trench.

The trench etching is performed by etching and removing the semiconductor substrate while a protective film is formed on a surface of the semiconductor substrate. An example of the semiconductor device production method according to the second aspect of the present disclosure includes performing trench etching to provide a structure in which a first pattern portion and a second pattern portion have the same temperature during the trench etching.

According to the above method, since the trench etching is performed in a state where the first pattern portion and the second pattern portion are at the same temperature during the trench etching, the etching is allowed to proceed in a state where the protective film uniformly adheres to the side walls of both the pattern portions. For that reason, according to the present production method, the roughness of the side walls between both the pattern portions can be appropriately reduced.

Another example of the semiconductor device production method according to the second aspect of the present disclosure includes performing trench etching for forming a trench in a thickness direction of a semiconductor substrate, and forming both of a first pattern portion and a second pattern portion whose side walls face each other across the trench.

The trench etching is performed by etching and removing the semiconductor substrate while a protective film is formed on a surface of the semiconductor substrate. In the present production method, the trench etching is performed to provide a structure in which the area of the entire outer surface of the first pattern portion is equal to the area of the entire outer surface of the second pattern portion.

According to the above method, since the heat radiation area during the trench etching is substantially the same between the first pattern portion and the second pattern portion, both of the pattern portions are likely to be in the same temperature state during the trench etching. For that reason, etching progresses in a state in which the protective film evenly adheres to the side walls of both of the pattern portions, so that the roughness of the side walls between both the pattern portions can be appropriately reduced.

BRIEF DESCRIPTION OF DRAWINGS

The above and other objects, features and advantages of the present disclosure will become more apparent from the following detailed description made with reference to the accompanying drawings, in which.

DETAILED DESCRIPTION

Figure 1:
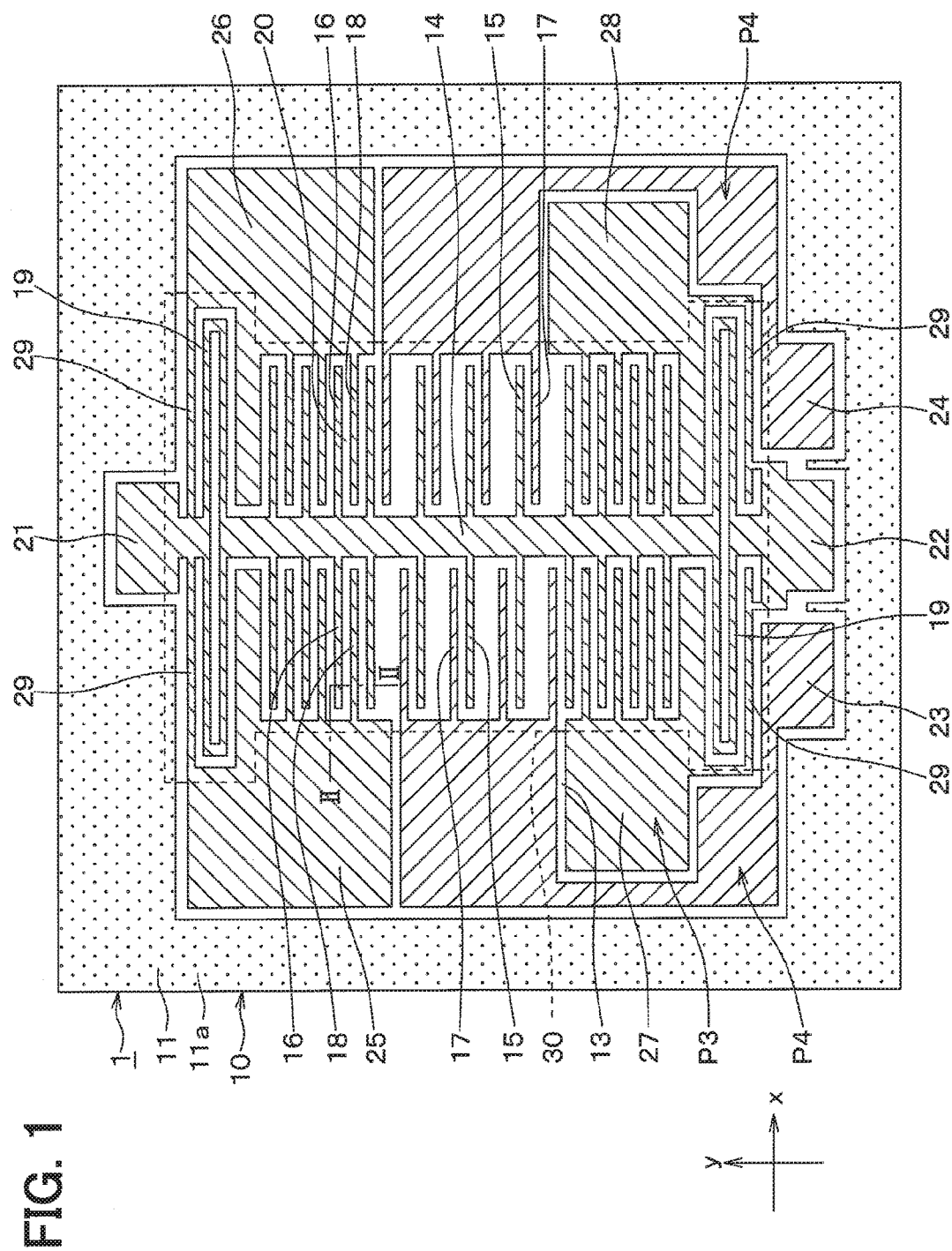
FIG. 1 is a schematic plan view showing an acceleration sensor as a semiconductor device according to a first embodiment.

Embodiments will be described hereinafter with reference to the drawings. Further, in the following respective drawings, portions which are the same as or equivalent to each other are denoted by the same reference numerals in the drawings for the sake of simplifying the description.

A semiconductor device according to a first embodiment is applied to, for example, an acceleration sensor as a semiconductor dynamic quantity sensor mounted on a vehicle such as an automobile. An acceleration sensor 1 which is a semiconductor device according to the first embodiment will be described with reference to FIGS. 1 and 2.

(Configuration of Acceleration Sensor, Etc.)

As shown in FIG. 1, the acceleration sensor 1 has a semiconductor layer 11. In the semiconductor layer 11, a trench 20 is provided to penetrate in a thickness direction. The semiconductor layer 11 is partitioned into multiple patterns by the trench 20. Side walls of the respective patterns are opposed to each other across the trench 20. For convenience, in a plan view shown in FIG. 1, in order to facilitate discrimination for each continuous region, different hatching is applied to each continuous region on a portion of a surface of the semiconductor layer 11 other than the trench 20. However, the hatching does not indicate a cross section. In other words, the portion not hatched in FIG. 1 corresponds to the trench 20.

In the present embodiment, the trench etching for forming the trench 20 is performed by etching and removing the semiconductor layer 11 while forming a protective film 4 on the surface of the semiconductor layer 11. Details will be described later with reference to FIGS. 3 to 10.

Figure 2:
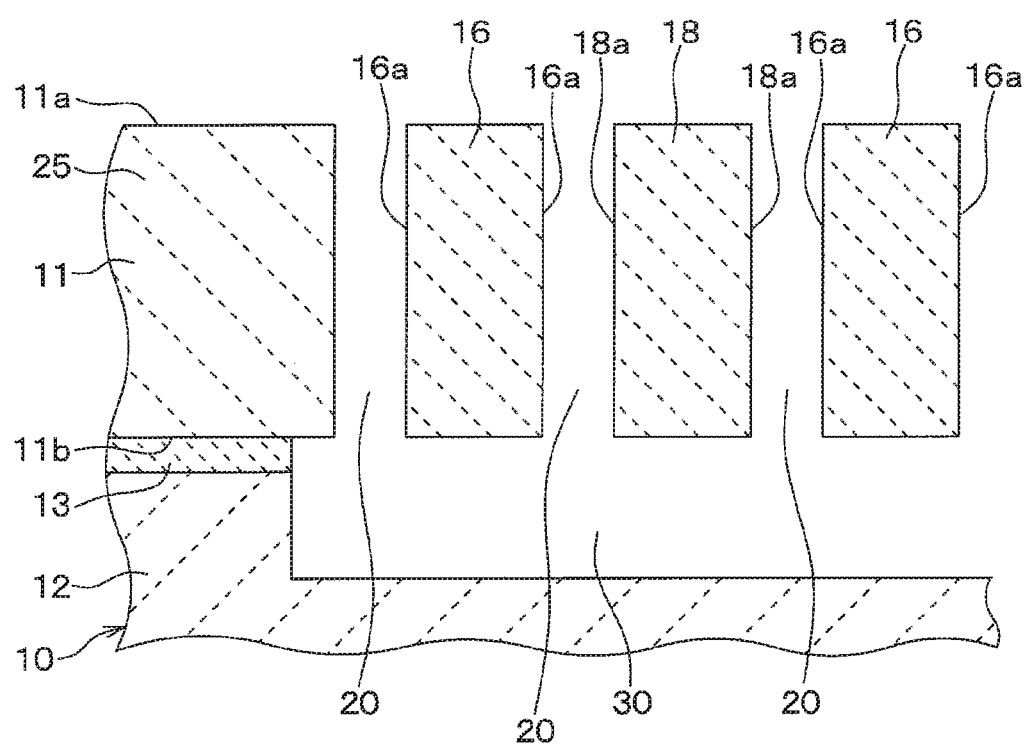
FIG. 2 is a schematic cross-sectional view partially showing a first pattern portion and a second pattern portion taken along a dash-dotted line II-II in FIG. 1.

In the trench etching, an upper surface 11a of the semiconductor layer 11 shown in FIG. 2 is a surface on a starting side of the trench etching in the semiconductor layer 11. The upper surface 11a of the semiconductor layer 11 is a surface subjected to the hatching described above in FIG. 1. A lower surface 11b on a side opposite to the upper surface 11a in the semiconductor layer 11 shown in FIG. 2 is a surface on an end side of the trench etching in the semiconductor layer 11.

As shown in FIG. 2, the acceleration sensor 1 of the present embodiment is configured with the use of the semiconductor substrate 10. In the semiconductor substrate 10, the lower surface 11b of the semiconductor layer 11 is joined to a support substrate 12 through an insulating film 13.

The semiconductor substrate 10 is typically formed of an SOI substrate. SOI is an abbreviation for silicon on insulator. In other words, the semiconductor substrate 10 as the SOI substrate is formed by joining the semiconductor layer 11 made of silicon and the support substrate 12 made of silicon through the insulating film 13 made of a silicon oxide film. However, the present disclosure is not limited to the configuration described above.

The semiconductor substrate 10 has a recessed portion 30. The recessed portion 30 is formed in a portion of the surface of the support substrate 12 adjacent to the semiconductor layer 11, which corresponds to a portion of the semiconductor layer 11 where the trench 20 is formed. The recessed portion 30 separates the semiconductor layer 11 from the support substrate 12. In FIG. 1, the recessed portion 30 provided in the support substrate 12 is indicated as a region surrounded by a broken line.

As shown in FIG. 1, the portion of the semiconductor layer 11 located in the region of the recessed portion 30 is spaced apart from the support substrate 12, where the insulating film 13 is not provided. In other words, this portion is configured as a floating portion floating from the support substrate 12. On the other hand, the portion of the semiconductor layer 11 located in the region outside the recessed portion 30 is joined to the support substrate 12 through the insulating film 13. In other words, this portion is configured as a support portion supported by the support substrate 12.

The trench 20 is formed by trench etching to penetrate the semiconductor layer 11 in the thickness direction from the upper surface 11a of the semiconductor layer 11 toward the lower surface 11b of the semiconductor layer 11. The floating portion and the support portion in the semiconductor layer 11 on the supporting substrate 12 are patterned by the trench 20.

In FIG. 1, in the trench 20 formed in the floating portion of the semiconductor layer 11, the recessed portion 30 of the support substrate 12 appears through the trench 20. On the other hand, in the trench 20 formed in the support portion of the semiconductor layer 11, the insulating film 13 appears through the trench 20.

As described above, in FIG. 1, for the sake of convenience, three different types of hatching including dot hatching, diagonal hatching downward to left, and diagonal hatching downward to right are applied to the surface of the semiconductor layer 11, that is, the upper surface 11a. In this case, the hatched region of the same type indicates a portion of the continuous semiconductor layer 11.

However, in FIG. 1, one region dot-hatched and one region diagonally hatched downward to left are provided, and two regions diagonally hatched downward to right are provided. In other words, in FIG. 1, the semiconductor layer 11 is separated into four consecutive portions by the trench 20.

The multiple patterns of the semiconductor layer 11 in the acceleration sensor 1 will be described more specifically. In FIG. 1, an x-direction indicating a horizontal direction in the figure and a y-direction indicating a vertical direction are indicated by arrows.

The pattern of the floating portion of the semiconductor layer 11 includes a weight portion 14, movable detection electrodes 15, movable damping electrodes 16, fixed detection electrodes 17, fixed damping electrodes 18, and detection beams 19. On the other hand, the pattern of the support portion of the semiconductor layer 11 includes a first anchor portion 21, a second anchor portion 22, a third anchor portion 23, a fourth anchor portion 24, a fifth anchor portion 25, a sixth anchor portion 26, a seventh anchor portion 27, and an eighth anchor portion 28.

The first anchor portion 21 and the second anchor portion 22 support a movable portion in which the weight portion 14, the movable detection electrodes 15, the movable damping electrodes 16, and the detection beams 19 are integrated together. The third anchor portion 23 and the fourth anchor portion 24 support the fixed detection electrodes 17. The fifth to eighth anchor portions 25 to 28 support the fixed damping electrodes 18.

The weight portion 14 providing the center of mass is formed in a bar shape extending in the y-direction in FIG. 1. Both end portions of the weight portion 14 in the y-direction are connected to the respective detection beams 19. The detection beams 19 each have a spring property in the y-direction. In the present embodiment, the detection beam 19 is formed in an elongated rectangular frame shape extending in the x-direction. The pair of detection beams 19 are respectively connected to the first anchor portion 21 and the second anchor portion 22.

With the above configuration, the weight portion 14 is displaceable in the y-direction. When the acceleration along the y-direction is applied to the acceleration sensor 1, the weight portion 14 is displaced according to a magnitude of the applied acceleration. The displacement is converted into an electric signal by a circuit not shown or the like, and is output to an outside as a detection signal of the acceleration.

The movable detection electrodes 15 and the movable damping electrodes 16 are comb teeth shaped protruding from the side surface of the weight portion 14 in the x-direction. In the present embodiment, as shown in FIG. 1, the multiple movable detection electrodes 15 are provided on both of the right and left sides at a near-center portion of the weight portion 14. In FIG. 1, three movable detection electrodes 15 are illustrated on each of the right and left sides of the weight portion 14. However, the number of movable detection electrodes 15 is not limited to the above number.

As shown in FIG. 1, the multiple movable damping electrodes 16 are provided on both of the right and left sides at portions closer to both ends of the weight portion 14 in the y-direction than the movable detection electrodes 15. In FIG. 1, four movable damping electrodes 16 are illustrated on each of the right and left sides of the weight portion 14 on the upper side of the weight portion 14 and four movable damping electrodes 16 are illustrated on each of the right and left sides of the weight portion 14 on the lower side of the weight portion 14. However, the number of movable detection electrodes 15 is not limited to the above number.

As shown in FIG. 1, the fixed detection electrodes 17 protrude from each of the third anchor portion 23 and the fourth anchor portion 24 along the x-direction. The fixed detection electrodes 17 are formed in a comb teeth shape and are disposed so as to be engaged with the movable detection electrodes 15 having the comb teeth shape described above. A portion in which a side wall of each movable detection electrode 15 and a side wall of the corresponding fixed detection electrode 17 face each other across the trench 20 is configured as an acceleration detection interval.

In other words, as described above, when the acceleration along the y-direction is applied to the acceleration sensor 1, the weight portion 14 is displaced. The displacement is output to the outside as a detection signal based on a change in capacitance attributable to a change in the detection interval. Appropriate portions of the first anchor portion 21 to the fourth anchor portion 24 are connected with the outside by wire bonding or the like to enable signal exchange with the outside.

As shown in FIG. 1, the fixed damping electrodes 18 are formed in a comb teeth shape. The comb-tooth shaped fixed damping electrodes 18 protrude respectively from the fifth anchor portion 25 to eighth anchor portion 28 along the x-direction and are disposed so as to mesh with the corresponding comb teeth shaped movable damping electrodes 16. FIG. 2 shows a state in which side walls 16a of the movable damping electrode 16 and side walls 18a of the fixed damping electrode 18 face each other across the trench 20.

Even if an excessive impact along the y-direction is applied to the acceleration sensor 1, an excessive displacement of the weight portion 14 can be reduced due to an air damping action between each movable damping electrode 16 and the corresponding fixed damping electrode 18. For that reason, damage to the weight portion 14 can be suppressed.

In the present embodiment, the movable damping electrodes 16 correspond to a first pattern portion, and the fixed damping electrodes 18 correspond to a second pattern portion. In addition, a facing distance between each movable damping electrode 16 and the corresponding fixed damping electrode 18, in other words, a width of the portion of the trench 20 defining the electrodes 16 and 18 is the smallest width in the trench 20. However, the present disclosure is not limited to the configuration described above.

As shown in FIG. 1, the movable damping electrode 16 and the fixed damping electrode 18 are connected to each other by coupling portions 29 as portions of the semiconductor layer 11 other than the electrodes 16 and 18.

In FIG. 1, four coupling portions 29 are provided: a coupling portion 29 that connects the first anchor portion 21 and the fifth anchor portion 25, a coupling portion 29 that connects the first anchor portion 21 and the sixth anchor portion 26, a coupling portion 29 that connects the second anchor portion 22 and the seventh anchor portion 27, and a coupling portion 29 that connects the second anchor portion 22 and the eighth anchor portion 28.

As a result, the movable damping electrodes 16 and the fixed damping electrodes 18 are configured as the same continuous semiconductor layer 11 through the coupling portions 29 and each of the anchor portions described above. Although the coupling portions 29 are formed in the floating portion of the semiconductor layer 11 in FIG. 1, the coupling portions 29 may be formed in the support portion of the semiconductor layer 11, and furthermore, may be formed over both of the floating portion and the support portion.

(Acceleration Sensor Production Method, Etc.)

Next, a method of producing the acceleration sensor 1 according to the present embodiment will be described with reference to FIGS. 3 to 10 in addition to FIGS. 1 and 2. According to the present production method, the acceleration sensor 1 shown in FIGS. 1 and 2 is formed.

First, the semiconductor substrate 10 is prepared in which the lower surface 11b of the semiconductor layer 11 is joined to the support substrate 12 through the insulating film 13 and the recessed portion 30 is provided in the support substrate 12. The semiconductor substrate 10 described above is formed, for example, in such a manner that the recessed portion 30 is formed in the support substrate 12 in advance, the insulating film 13 is formed on one of the support substrate 12 and the semiconductor layer 11, and the support substrate 12 and the semiconductor layer 11 are joined to each other through the insulating film 13. In this case, the recessed portion 30 becomes a hollow portion inside the semiconductor substrate 10.

Next, an entire flow of trench etching will be described with reference to FIGS. 3 to 10, and trench etching in the floating portion of the semiconductor layer 11 will be described herein as an example. The trench etching is basically similar to a typical one, and performed by etching and removing the semiconductor layer 11 while forming the protective film 4 on the surface of the semiconductor layer 11, that is, the upper surface 11a.

In the trench etching according to the present embodiment, the following first to third steps are sequentially repeated. However, the present disclosure is not limited to the above configuration. In the first step, the protective film 4 is formed on the entire upper surface 11a of the semiconductor layer 11. In the subsequent second step, a portion of the protective film 4 is removed in the trench forming portion 20a in which the trench 20 is to be formed in the upper surface 11a of the semiconductor substrate 10. In the subsequent third step, the semiconductor layer 11 is removed by isotropic etching in the trench forming portion 20a.

Figure 3:
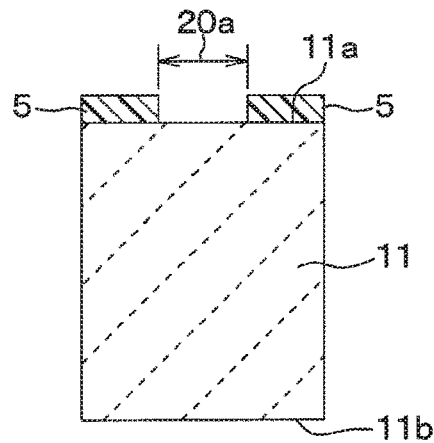
FIG. 3 is a cross-sectional view showing a step of trench etching in a semiconductor device production method according to the first embodiment.

The trench etching in which the first step, the second step, and the third step are sequentially performed will be described more specifically with reference to FIGS. 3 to 10. First, as shown in FIG. 3, a mask 5 is formed on a portion of the upper surface 11a of the semiconductor layer 11 other than the trench forming portion 20a.

Figure 4:
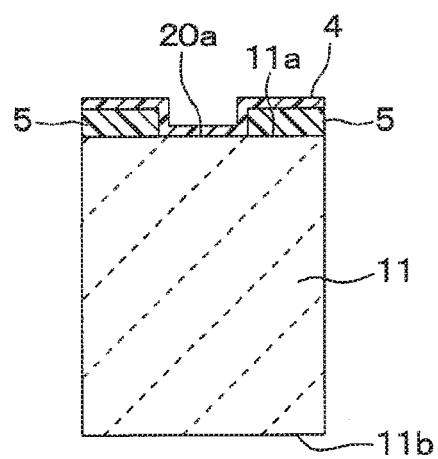
FIG. 4 is a cross-sectional view showing the step of the trench etching continued from FIG. 3.

Next, as shown in FIG. 4, the first step is performed to form the protective film 4 on the entire upper surface 11a of the semiconductor layer 11. As a result, the protective film 4 is formed on the surface of the mask 5 and the trench forming portion 20a. In the first step, the protective film 4 made of a polymer such as fluorocarbon is formed with the use of a gas such as $C_4F_8$.

Figure 5:
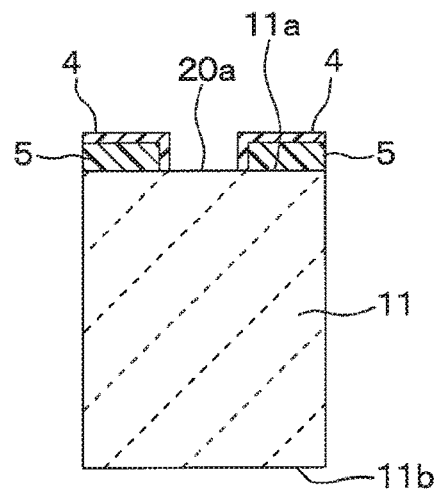
FIG. 5 is a cross-sectional view showing the step of the trench etching continued from FIG. 4.

Next, as shown in FIG. 5, the second step is performed to remove the protective film 4 in the trench forming portion 20a. In the second step, the protective film 4 in the trench forming portion 20a between the masks 5 is removed with the use of a gas such as $SF_6$. In the step, a negative bias potential is applied to the substrate, and cations in plasma are accelerated in a direction perpendicular to the substrate to collide with the substrate, so that the protective film on the substrate surface is removed.

Figure 6:
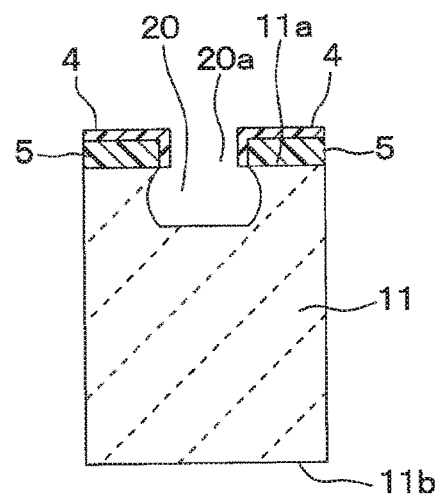
FIG. 6 is a cross-sectional view showing the step of the trench etching continued from FIG. 5.

Next, as shown in FIG. 6, the third step is performed, in which the semiconductor layer 11 is isotropically etched and removed in the trench forming portion 20a from which the protective film 4 has been removed. As a result, a part of the trench 20 is formed in the trench forming portion 20a. In the third step, as in the second step, for example, a gas such as $SF_6$ is used.

Figure 7:
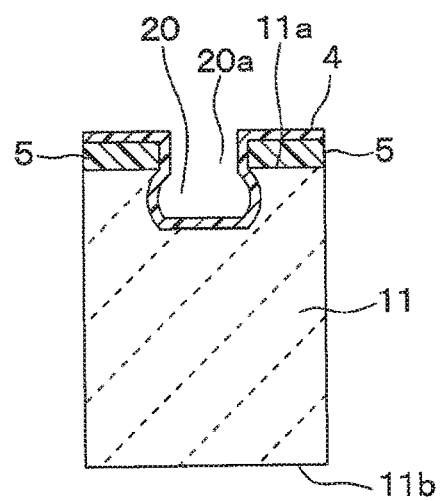
FIG. 7 is a cross-sectional view showing the step of the trench etching continued from FIG. 6.

Subsequently, as shown in FIG. 7, the first step is performed again to form the protective film 4 on the entire upper surface 11a of the semiconductor layer 11. As a result, the protective film 4 is formed on the surface of the mask 5 and the side wall and a bottom portion of the partially formed trench 20.

Figure 8:
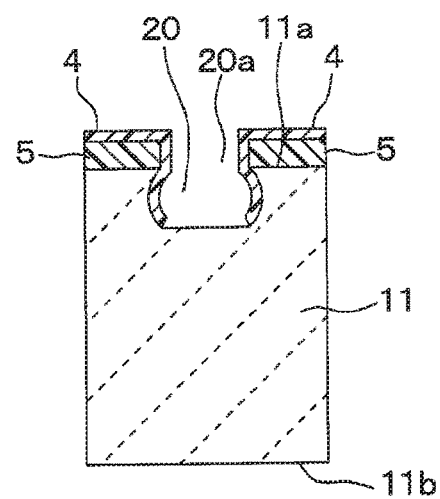
FIG. 8 is a cross-sectional view showing the step of the trench etching continued from FIG. 7.

Next, as shown in FIG. 8, similarly to the above process, the second step using a gas such as $SF_6$ is performed to remove the protective film 4 located at the bottom portion of the partially formed trench 20 in the trench forming portion 20a.

Figure 9:
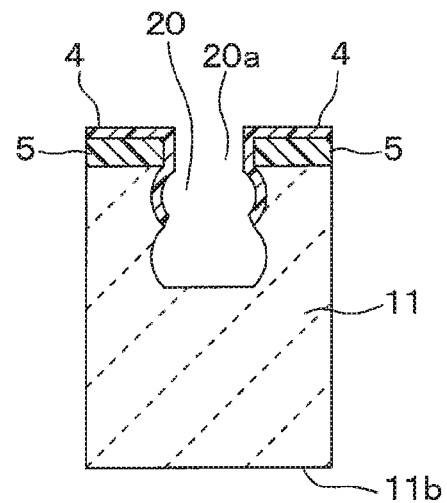
FIG. 9 is a cross-sectional view showing the step of the trench etching continued from FIG. 10.

Subsequently, as shown in FIG. 9, as in the above process, the third step using a gas such as $SF_6$ is performed, in which the semiconductor layer 11 is isotropically etched and removed in the trench forming portion 20a from which the protective film 4 has been removed. As a result, the trench 20 further deepened is formed in the trench forming portion 20a.

Figure 10:
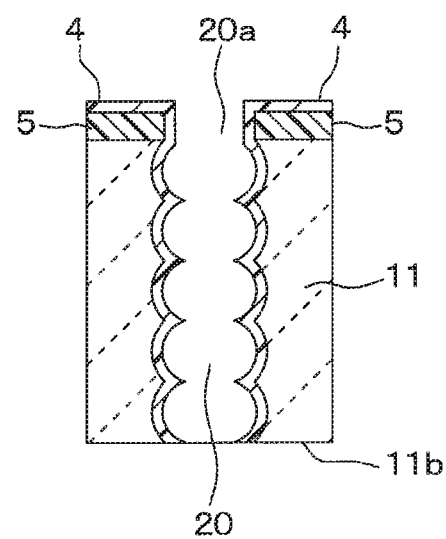
FIG. 10 is a cross-sectional view showing the step of the trench etching continued from FIG. 9.

As shown in FIGS. 4 to 9, the first step, the second step, and the third step are sequentially repeated, as a result of which, as shown in FIG. 10, the trench 20 that has reached the lower surface 11b of the semiconductor layer 11 is finally completed in the floating portion of the semiconductor layer 11.

In the support portion of the semiconductor layer 11, the trench 20 is provided to reach the insulating film 13. After the state shown in FIG. 10, the mask 5 and the protective film 4 are removed by ashing or the like. With the above process, the acceleration sensor 1 in a state shown in FIGS. 1 and 2 is completed.

In the trench etching described above, in the present production method, the trench etching is performed so that the movable damping electrode 16 and the fixed damping electrode 18 are connected to each other by the coupling portions 29 described above after the trench 20 has been formed.

As described above, the coupling portion 29 is a portion of the semiconductor layer 11 other than the two electrodes 16 and 18. The two electrodes 16 and 18 are configured in the same continuous semiconductor layer 11, as shown by the region diagonally hatched downward to left in FIG. 1. Since the trench etching is performed in this state, the electrodes 16 and 18 are in a state having the same potential during the trench etching.

In this way, according to the production method of the present embodiment, during the trench etching and after the trench etching, the movable damping electrode 16 and the fixed damping electrode 18 are formed in the same continuous semiconductor layer including the coupling portion 29. Therefore, according to the present embodiment, the trench etching can be performed to provide a state in which both of the electrodes 16 and 18 have the same potential without the use of a metal wire that electrically connects both of the electrodes 16 and 18 to each other.

In addition, the acceleration sensor 1 according to the present embodiment is configured using the semiconductor substrate 10 in which the support substrate 12, the insulating film 13, and the semiconductor layer 11 are sequentially stacked on each other from the support substrate 12 side as shown in FIG. 2. In the semiconductor substrate 10, the recessed portion 30 is provided in the support substrate 12 at the portion corresponding to the floating portion of the portion where the trench 20 is formed in the semiconductor layer 11.

In a case where the recessed portion 30 is not provided, after the trench 20 has been formed in the semiconductor layer 11, there is a need to remove the insulating film 13 by sacrificial layer etching or the like so as to provide the floating portion. However, according to the present embodiment, in the semiconductor substrate 10, the semiconductor layer 11 and the support substrate 12 are spaced apart from each other by the recessed portion 30 in advance. For that reason, a floating portion can be formed by merely subjecting the semiconductor layer 11 to trench etching without performing the sacrificial layer etching as described above.

(Third Pattern Portion and Fourth Pattern Portion)

In the production method according to the present embodiment, pattern portions that are separated by the formation of the trench 20 and are electrically isolated from each other are also formed in the semiconductor layer 11. The above pattern portions include one third pattern portion P3 indicated by the region diagonally hatched downward to left in FIG. 1 and two fourth pattern portions P4 indicated by the regions diagonally hatched downward to right in FIG. 1. Those three pattern portions are separated from each other and electrically isolated from each other.

Specifically, referring to FIG. 1, the third pattern portion P3 corresponds to the weight portion 14, the movable detection electrodes 15, the movable damping electrodes 16, the fixed damping electrodes 18, the detection beams 19, the first anchor portion 21, the second anchor portion 22, and the fifth to eighth anchor portions 25 to 28.

One fourth pattern portion P4 located on the left side in FIG. 1 corresponds to the third anchor portion 23 and the fixed detection electrode 17 supported by the third anchor portion 23. One fourth pattern portion P4 located on the right side in FIG. 1 corresponds to the fourth anchor portion 24 and the fixed detection electrode 17 supported by the fourth anchor portion 24.

Since the third pattern portion P3 and the fourth pattern portions P4 are discontinuous parts of the semiconductor layer 11, the technique of equalizing the potentials of these patterns using the coupling portion 29 in the trench etching cannot be used. Therefore, in the production method according to the present embodiment, another technique as shown in FIG. 11 is employed to bring the third pattern portion P 3 and the fourth pattern portions P4 into the same potential state during the trench etching.

The another method is applied between one third pattern portion P3 and one fourth pattern portion P4, and the another method is also applied between one third pattern portion P3 and another fourth pattern portion P4 in the same manner.

Figure 11:
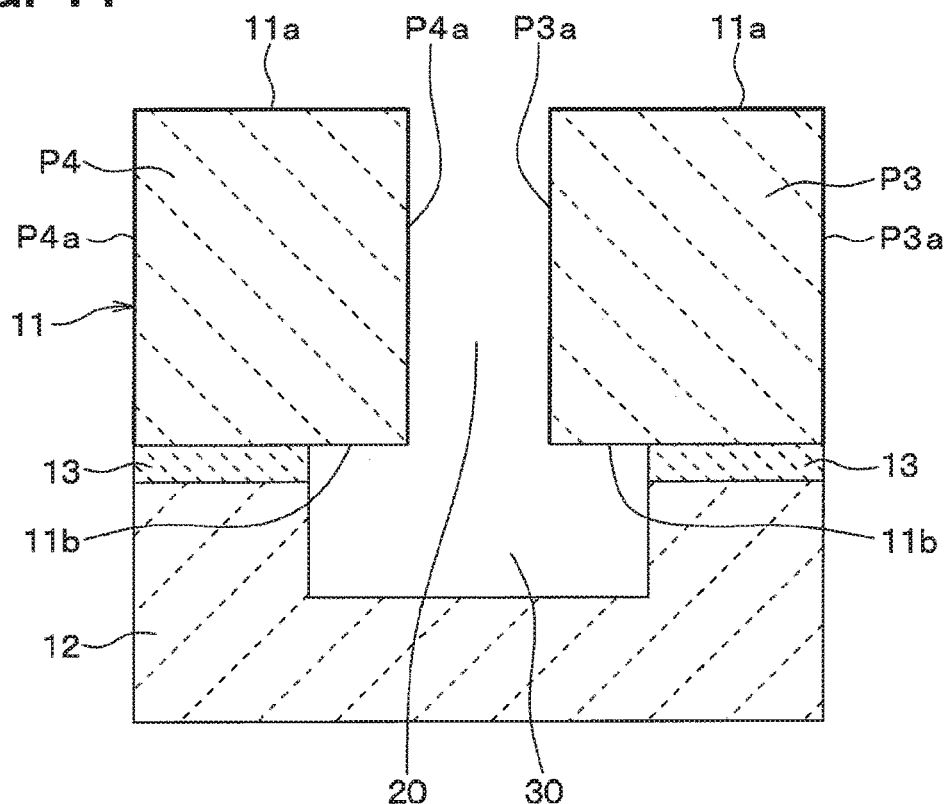
FIG. 11 is a schematic cross-sectional view modeling a cross-sectional configuration of a third pattern portion and a fourth pattern portion that are electrically isolated from each other in FIG. 1.

FIG. 11 shows a schematic cross section including a floating portion and a fixing portion of the semiconductor layer 11 for one third pattern portion P3 and one fourth pattern portion P4. In other words, the third pattern portion P3 shown on the right side in FIG. 11 corresponds to one entire third pattern portion P3, and the fourth pattern portion P4 shown on the left side in FIG. 11 corresponds to one entire fourth pattern portion P4.

In the present production method, the trench etching shown in FIGS. 3 to 10 described above is performed to form the third pattern portion P3 and the fourth pattern portion P4 in the semiconductor layer 11 as shown in FIG. 11.

As shown in FIG. 11, a side wall P3a of the third pattern portion P3 and a side wall P4a of the fourth pattern portion P4 face each other across the trench 20. After the formation of the trench 20, the third pattern portion P3 and the fourth pattern portion P4 are electrically isolated from each other.

In other words, the third pattern portion P3 and the fourth pattern portion P4 correspond to one pattern portion and another pattern portion whose side walls P3a and P4a face each other across the trench 20 and are mutually electrically isolated from each other after the formation of the trench 20.

The technique shown in FIG. 11 focuses on the amount of electric charge flowing into the third pattern portion P3 and the fourth pattern portion P4 during the trench etching. During the trench etching, electric charges flow into the third pattern portion P3 and the fourth pattern portion P4 by plasma.

In the inflow of the electric charges in the trench etching, the dominant inflow is from the surfaces of the third pattern portion P3 and the fourth pattern portion P4 on the trench etching starting side, that is, from the upper surface 11a of the semiconductor layer 11 and the side walls P3a and P4a of the respective pattern portions P3 and P4.

Therefore, the present inventors have paid attention to making the amounts of electric charges flowing into the respective pattern portions P3 and P4 equal to each other. A total area of the upper surface 11a and the side wall P3a of the semiconductor layer 11 in the third pattern portion P3 is denoted by S3. Further, a total area of the upper surface 11a and the side wall P4a of the semiconductor layer 11 in the fourth pattern portion P4 is denoted by S4.

The respective surfaces for the total areas S3 and S4 are indicated by bold lines in FIG. 11. In the present embodiment, trench etching is performed so that the third pattern portion P3 and the fourth pattern portion P4 are structured to make the total areas S3 and S4 of the third pattern portion P3 and the fourth pattern portion P4 equal to each other.

With the above process, the amounts of electric charges flowing during the trench etching can be made equal between the third pattern portion P3 and the fourth pattern portion P4, so an occurrence of the potential difference between those pattern portions can be reduced. Therefore, even with the above technique, the trench etching can be performed in a state where both the pattern portions have the same potential without the use of the metal wire that electrically connects both the pattern portions to each other.

In addition, the third pattern portion P3 and the fourth pattern portion P4 are structured to have the same area during the trench etching, as a result of which the heat radiation areas during the trench etching are substantially equal between the third pattern portion P3 and the fourth pattern portion P4. For that reason, according to the present embodiment, the trench etching is performed in a state where both of the pattern portions P3 and P4 have the same temperature during the trench etching. Therefore, according to the present embodiment, occurrence of various troubles due to a temperature difference between the two pattern portions P3 and P4 during the trench etching can be satisfactorily reduced. In other words, when the third pattern portion P3 and the fourth pattern portion P4 are structured to have the same area during the trench etching, not only the side wall roughness caused by the occurrence of the potential difference between those pattern portions but also the side wall roughness caused by the occurrence of the temperature difference between those pattern portions can be reduced. Matters concerning the occurrence of the temperature difference between the two pattern portions will be described later in the description of a second embodiment.

These features are applicable, as described above, to a relationship between the fourth pattern portion P4 and the third pattern portion P3 on the left side in FIG. 1 and a relationship between the fourth pattern portion P4 and the third pattern portion P3 on the right side in FIG. 1, respectively.

Further, in the technique shown in FIG. 11, it is preferable to further employ the following method. As described above, electric charges flow into the third pattern portion P3 and the fourth pattern portion P4 from plasma during the trench etching.

The electric charges escape as a leakage current from the third pattern portion P3 and the fourth pattern portion P4 during the trench etching. In this case, the electric charges escape from the third pattern portion P3 and the fourth pattern portion P4 dominantly through electric discharge from the insulating film 13 supporting the pattern portions rather than through air discharge.

Therefore, in the present embodiment, it is desirable to perform the trench etching in a state where a joint surface area between one third pattern portion P3 and the insulating film 13 is equal to a joint surface area between one fourth pattern portion P4 and the insulating film 13.

More specifically, referring to FIG. 1, the joint surface area between the third pattern portion P3 and the insulating film 13 corresponds to the area of the insulating film 13 located immediately below the first anchor portion 21, the second anchor portion 22, and the fifth to eighth anchor portions 25 to 28.

In addition, the joint surface area between one fourth pattern portion P4 located on the left side in FIG. 1 and the insulating film 13 corresponds to the area of the insulating film 13 located immediately below the third anchor portion 23. On the other hand, the joint surface area between one fourth pattern portion P4 located on the right side in FIG. 1 and the insulating film 13 corresponds to the area of the insulating film 13 located immediately below the fourth anchor portion 24.

As described above, the trench etching between the third pattern portion P3 and the fourth pattern portion P4 should be performed in a state where the joint surface areas are equal to each other, so that the amounts of electric charges escaping through the insulating film 13 can be easily made equal between both of the pattern portions.

Therefore, even with the above technique, the trench etching can be performed in a state where both the pattern portions have the same potential without the use of the metal wire that electrically connects both the pattern portions to each other. The technique based on the joint surface area of the insulating film 13 may be performed independently of the above technique based on the total areas S3 and S4.

In the present embodiment, the term "the same potential" not only means exactly the same potential, but also may mean not exactly the same potential as long as the present embodiment has the effect of reducing the side wall roughness. Furthermore, making the total areas S3 and S4 equal to each other and making the joint surface areas with the insulating film 13 equal to each other not only mean making them exactly equal, but also may mean making them not exactly equal as long as the present embodiment has the above effect.

The trench etching technique in which the movable damping electrodes 16 and the fixed damping electrodes 18 are connected to each other by the coupling portion 29 and the etching technique for the third pattern portion P3 and the fourth pattern portion P4 in FIG. 11 may be combined together or may each be performed independently.

In other words, in the trench etching for the acceleration sensor 1, all the three techniques: the coupling portion 29 technique, the technique based on the total areas S3 and S4, and the technique based on the joint surface area of the insulating film 13 may be employed. Alternatively, only two of the three techniques may be employed, or only one technique may be employed. In any case, the effect of each technique is exerted as described above, so that the trench etching can be performed in a state where both of the pattern portions have the same potential in each technique.

Modification of First Embodiment

As shown in FIG. 2, the acceleration sensor 1 according to the above embodiment is configured with the use of the semiconductor substrate 10 in which the lower surface 11b of the semiconductor layer 11 is joined to the support substrate 12 through the insulating film 13. In FIG. 2, with the provision of the recessed portion 30 in a part of the support substrate 12, a cavity formed by the recessed portion 30 is present between the support substrate 12 and the semiconductor layer 11 on the recessed portion 30.

Figure 12:
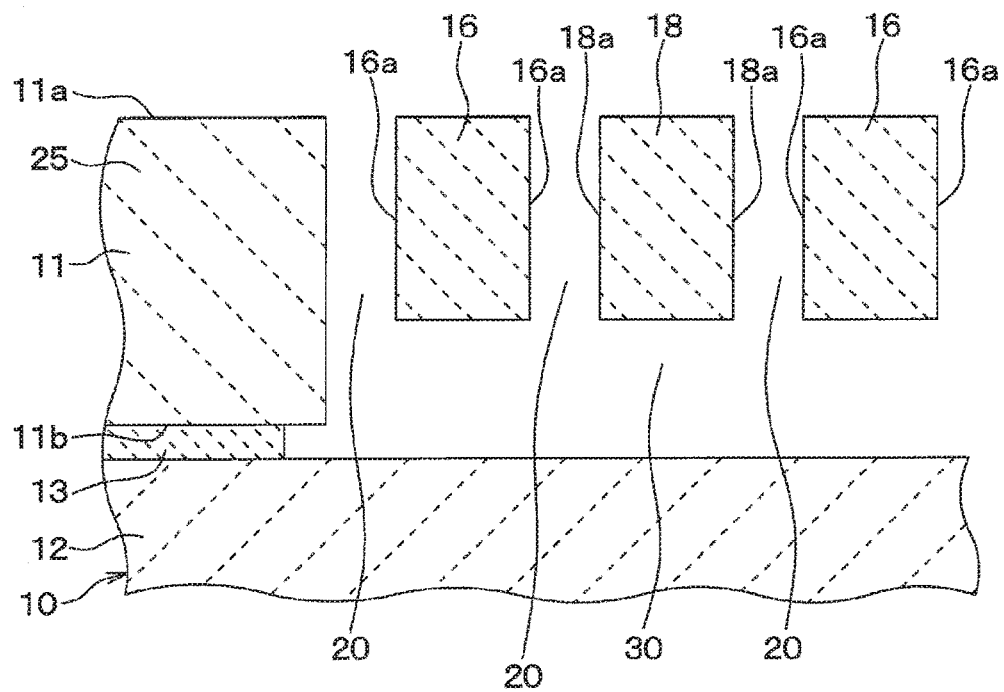
FIG. 12 is a schematic cross-sectional view showing a main part of a semiconductor device according to a modification of the first embodiment.

On the other hand, as shown in FIG. 12, the semiconductor substrate 10 in which the recessed portion 30 is provided on the surface of the semiconductor layer 11 adjacent to the support substrate 12, that is, on the lower surface 11b of the semiconductor layer 11 may be used. Also in this case, the recessed portion 30 exerts the effect that the pattern of the floating portion of the semiconductor layer 11 can be formed by merely performing the trench etching.

Furthermore, the semiconductor substrate 10 in which the entire surfaces of the lower surface 11b of the semiconductor layer 11 and the surface of the support substrate 12 which faces the lower surface 11b are joined to each other through the insulating film 13 may be used without the provision of the recessed portion 30. In this case, after the trench 20 has been formed in the semiconductor layer 11 by trench etching, the floating portion may be formed by removing the insulating film 13 by sacrificial layer etching or the like in a portion where the floating portion is to be formed.

Second Embodiment

A semiconductor device according to a second embodiment will be described with reference to FIGS. 13 and 14. The semiconductor device is applied to, for example, a semiconductor dynamic quantity sensor, such as an acceleration sensor mounted on a vehicle such as an automobile.

Figure 13:
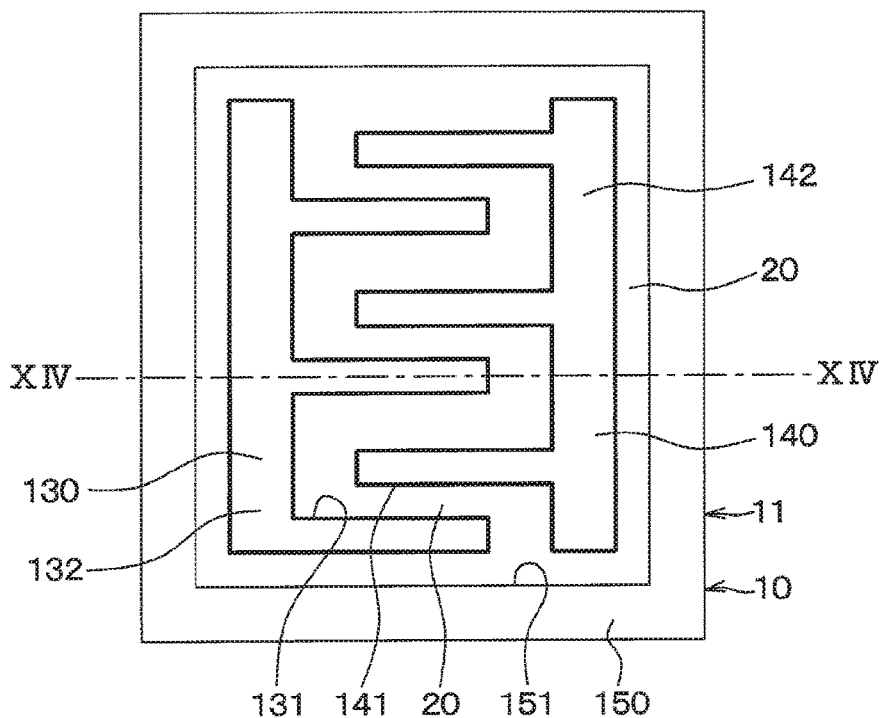
FIG. 13 is a schematic plan view showing a state of a semiconductor device immediately after completion of trench etching according to a second embodiment.
Figure 14:
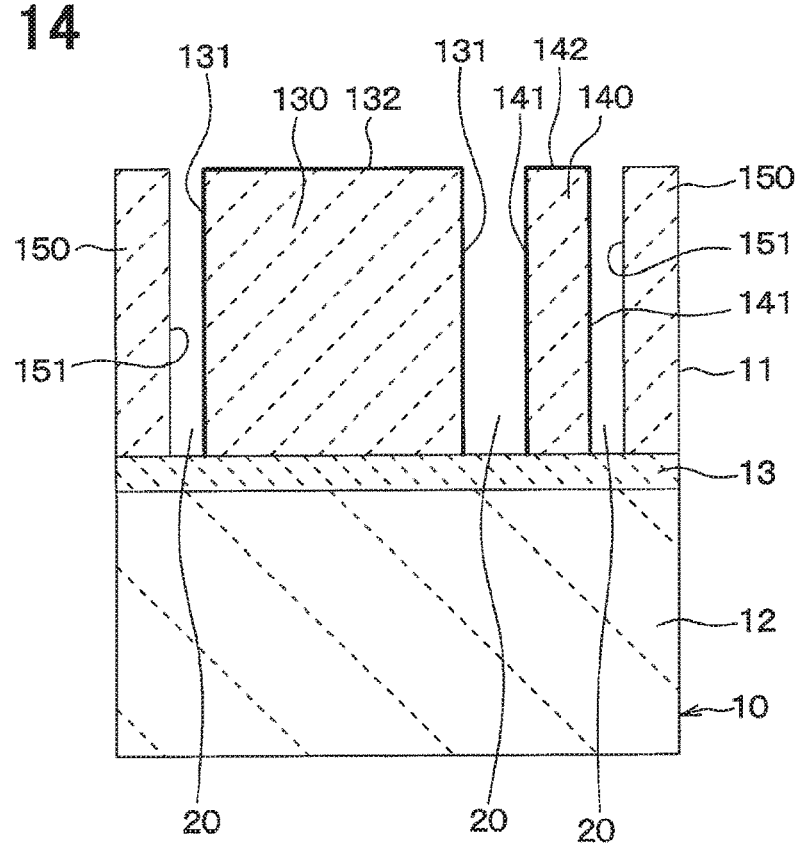
FIG. 14 is a schematic cross-sectional view taken along a dash-dotted line—XIV-XIV in FIG. 13.

FIGS. 13 and 14 show a structure of the semiconductor device immediately after completion of trench etching. The semiconductor substrate 10 is a so-called SOI substrate and is configured by joining a support substrate 12 which is a support silicon layer to a semiconductor layer 11 which is a surface silicon layer across an insulating film 13 made of a silicon oxide film.

The trench etching forms the trench 20 that reaches the insulating film 13 from the upper surface of the semiconductor layer 11. With the trench 20 formed in the thickness direction of the semiconductor substrate 10 as described above, the semiconductor layer 11 is partitioned into a first pattern portion 130, a second pattern portion 140, and a frame portion 150 that surrounds those pattern portions.

The side wall 131 of the first pattern portion 130, the side wall 141 of the second pattern portion 140, and a side wall 151 of the frame portion 150 face each other across the trench 20. The first pattern portion 130 and the second pattern portion 140 are electrically insulated from each other by the insulating film 13 and the trench 20, and are configured as electrodes that are electrically isolated from each other, for example.

The shapes of the first pattern portion 130 and the second pattern portion 140 are not particularly limited in the present disclosure. In one specific example, as shown in FIGS. 13 and 14, the first pattern portion 130 and the second pattern portion 140 form a plane comb teeth shape. Such a shape is, for example, a shape of a movable electrode and a fixed electrode in a typical acceleration sensor.

In that case, one of both the pattern portions 130 and 140 is the movable electrode and the other is the fixed electrode. With the application of an acceleration, a distance between the two electrodes, in other words, a distance between the side walls 131 and 141 of the two pattern portions 130 and 140 is changed so that the acceleration is detected.

Although not shown, when both of the pattern portions 130 and 140 are the movable electrode and the fixed electrode, as with the ordinary acceleration sensor, a part of the insulating film 13 located immediately below both of the pattern portions 130 and 140 is removed.

A part of the insulating film 13 is removed by further subjecting the insulating film 13 to sacrificial layer etching from the state immediately after the trench etching shown in FIG. 14. In other words, one of the two pattern portions 130 and 140, which is the movable electrode, is floated from the support substrate 12 into a displaceable state, to thereby form the semiconductor device as the acceleration sensor.

Next, a method of producing the semiconductor device according to the present embodiment will be described with reference to FIGS. 13 to 22. According to the present production method, the semiconductor device is formed up to the state immediately after the completion of the trench etching shown in FIGS. 13 and 14. First, the trench etching will be described. In the present embodiment, the trench etching is basically similar to a typical one, and performed by etching and removing the semiconductor layer 10 while forming the protective film 4 on the surface of the semiconductor substrate 10.

In the trench etching according to the present embodiment, the following first to third steps are sequentially repeated. However, the present disclosure is not limited to the above configuration. In the first step, the protective film 4 is formed on the entire surface of the semiconductor substrate 10. The surface of the semiconductor substrate 10 is a surface located on the side where the trench 20 is to be formed, and corresponds to the surface of the semiconductor layer 11 in the present embodiment.

In the subsequent second step, the protective film 4 is removed in the trench forming portion 20a in which the trench 20 is to be formed in the surface of the semiconductor substrate 10. In the subsequent third step, the semiconductor substrate 10 is removed by isotropic etching in the trench forming portion 20a.

The trench etching in which the first step, the second step, and the third step are sequentially performed will be described more specifically with reference to FIGS. 15 to 22.

Figure 15:
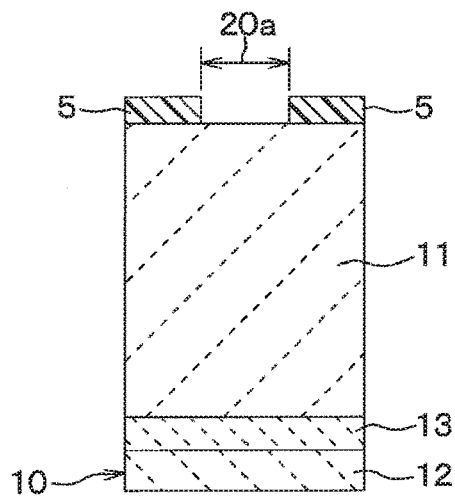
FIG. 15 is a cross-sectional view showing a step of trench etching in a semiconductor device production method according to the second embodiment.

First, as shown in FIG. 15, a mask 5 is formed on a portion of the surface of the semiconductor layer 11, in which the trench 20 is to be formed in the semiconductor substrate 10, other than the trench forming portion 20a.

Figure 16:
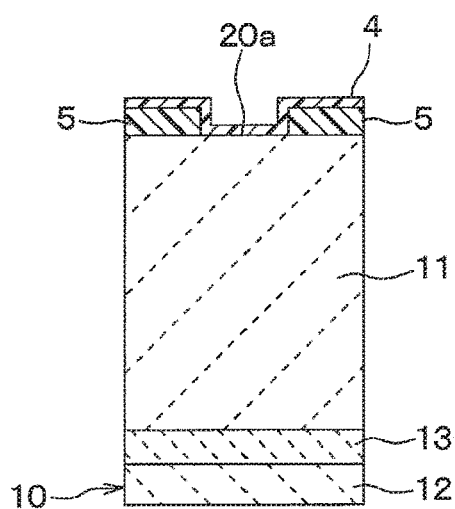
FIG. 16 is a cross-sectional view showing the step of the trench etching continued from FIG. 15.

Next, as shown in FIG. 16, the first step is performed to form the protective film 4 on the entire surface of the semiconductor substrate 10. As a result, the protective film 4 is formed on the surface of the mask 5 and the trench forming portion 20a. In the first step, the protective film 4 made of a polymer such as fluorocarbon is formed with the use of a gas such as $C_4F_8$.

Figure 17:
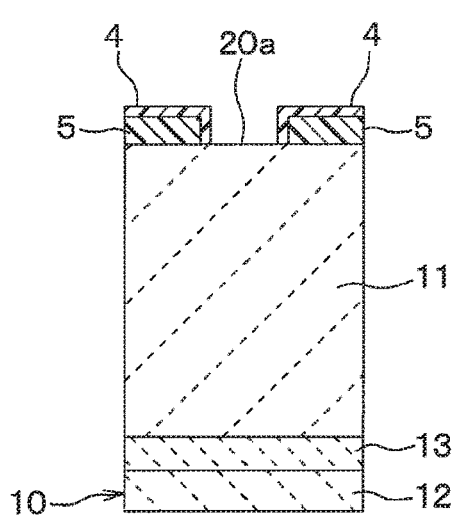
FIG. 17 is a cross-sectional view showing the step of the trench etching continued from FIG. 16.

Next, as shown in FIG. 17, the second step is performed to remove the protective film 4 in the trench forming portion 20a. In the second step, the protective film 4 in the trench forming portion 20a between the masks 5 is removed with the use of a gas such as $SF_6$.

Figure 18:
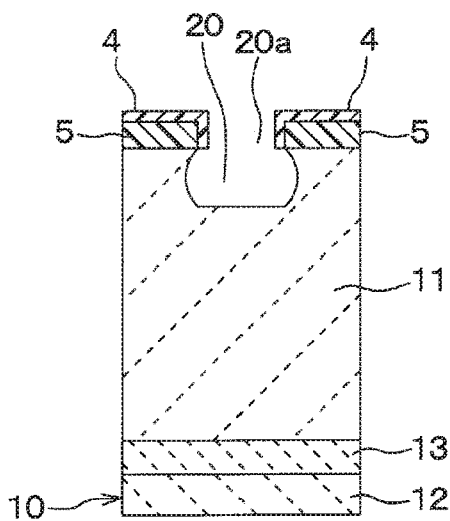
FIG. 18 is a cross-sectional view showing the step of the trench etching continued from FIG. 17.

Next, as shown in FIG. 18, the third step is performed, in which the semiconductor layer 11 of the semiconductor substrate 10 is isotropically etched and removed in the trench forming portion 20a from which the protective film 4 has been removed. As a result, a part of the trench 20 is provided in the trench forming portion 20a. In the third step, as in the second step, for example, a gas such as $SF_6$ is used.

Figure 19:
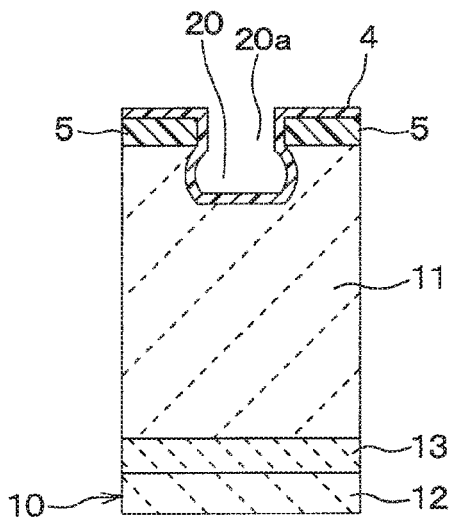
FIG. 19 is a cross-sectional view showing the step of the trench etching continued from FIG. 18.

Subsequently, as shown in FIG. 19, the first step is performed again to form the protective film 4 on the entire surface of the semiconductor substrate 10. As a result, the protective film 4 is formed on the surface of the mask 5 and the side wall and a bottom portion of the partially formed trench 20.

Figure 20:
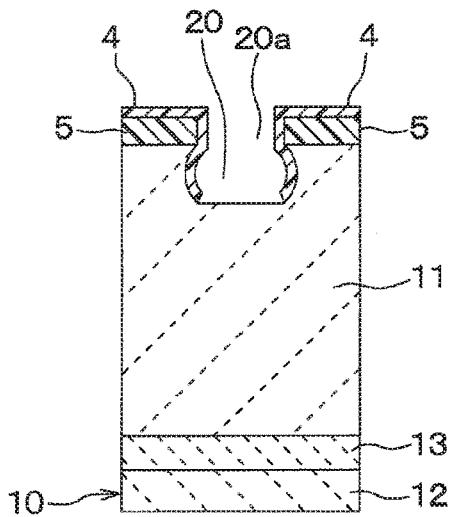
FIG. 20 is a cross-sectional view showing the step of the trench etching continued from FIG. 19.

Next, as shown in FIG. 20, similarly to the above process, the second step using a gas such as $SF_6$ is performed to remove the protective film 4 located at the bottom portion of the partially formed trench 20 in the trench forming portion 20a.

Figure 21:
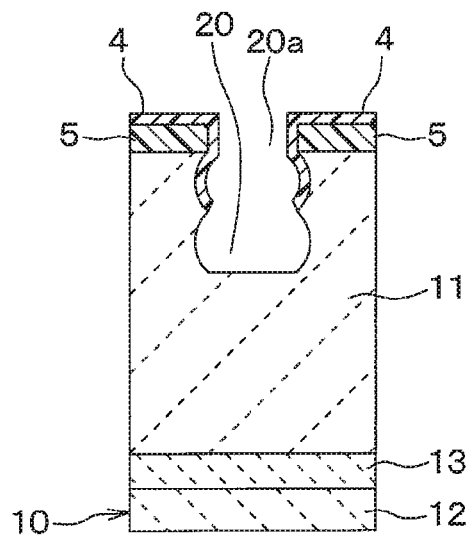
FIG. 21 is a cross-sectional view showing the step of the trench etching continued from FIG. 20.

Subsequently, as shown in FIG. 21, as in the above process, the third step using a gas such as $SF_6$ is performed, in which the semiconductor substrate 10 is isotropically etched and removed in the trench forming portion 20a from which the protective film 4 has been removed. As a result, the trench 20 further deepened is provided in the trench forming portion 20a.

Figure 22:
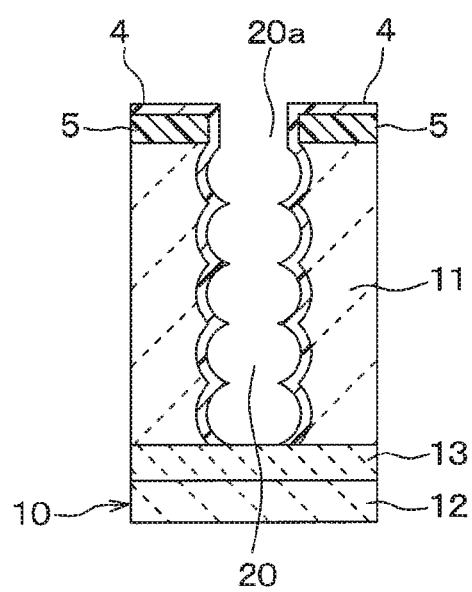
FIG. 22 is a cross-sectional view showing the step of the trench etching continued from FIG. 21.

As shown in FIGS. 16 to 21, the first step, the second step, and the third step are sequentially repeated, as a result of which, as shown in FIG. 22, the trench 20 that has reached the insulating film 13 is finally completed. After the state shown in FIG. 22, the mask 5 and the protective film 4 are removed by ashing or the like. With the above process, the semiconductor device in the state shown in FIGS. 13 and 14 is completed.

In the production method according to the present embodiment, the trench etching is performed to provide a structure in which the first pattern portion 130 and the second pattern portion 140 have the same temperature during the trench etching. The term "during trench etching" corresponds to a period from a time when the trench etching is started in the first step to a time when the trench 20 reaches the insulating film 13 in the third step.

More specifically, the structure in which both of the pattern portions 130 and 140 have the same temperature during trench etching means a structure in which an area of an entire outer surface of the first pattern portion 130 is equal to an area of an entire outer surface of the second pattern portion 140.

The outer surface of the first pattern portion 130 corresponds to the upper surface 132 and the side wall 131 of the first pattern portion 130, and the outer surface of the second pattern portion 140 corresponds to the upper surface 142 and the side wall 141 of the second pattern portion 140.

Figure 23:
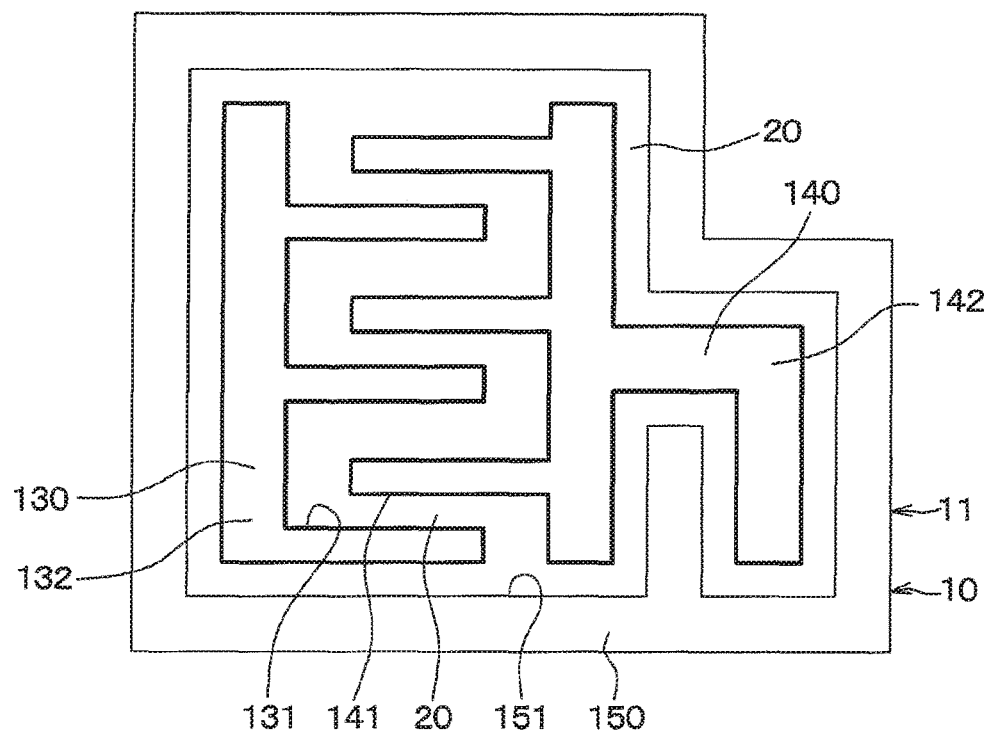
FIG. 23 is a schematic plan view showing a semiconductor device as a comparative example.

In FIGS. 13 and 14 and FIG. 23 to be described later, the portions forming the side walls 131 and 141 and the upper surfaces 132 and 142, which correspond to the outer surfaces of both the pattern portions 130 and 140, are indicated by thick lines for the sake of convenience of distinction. The respective upper surfaces 132 and 142 correspond to the upper surface of the semiconductor layer 11.

The outer surfaces of both the pattern portions 130 and 140 are heat radiation surfaces to the outside air in both the pattern portions 130 and 140. According to the trench etching of the present embodiment, the heat radiation areas during the trench etching are substantially equal between the first pattern portion 130 and the second pattern portion 140.

For that reason, according to the present embodiment, the trench etching is performed in a state where both of the pattern portions 130 and 140 have the same temperature during the trench etching. With the above process, the etching progresses with the protective film 4 evenly adhering to the side walls 131 and 141 of both the pattern portions 130 and 140. As a result, according to the present embodiment, the roughness of the side walls 131 and 140 of both the pattern portions 130 and 140 can be appropriately reduced.

On the other hand, in a comparative example shown in FIG. 23, the area of the outer surface of the second pattern portion 140, that is, the entire area of the side wall 141 and the upper surface 142 is remarkably larger than the area of the outer surface of the first pattern portion 130, that is, the entire area of the side wall 131 and the upper surface 132. In such a case, during the trench etching, the first pattern portion 130 becomes higher in temperature than the second pattern portion 140, and the adhesion of the protective film 4 is insufficient on the side wall of the first pattern portion 130 as described above.

Incidentally, making the areas of the entire outer surfaces equal between both the pattern portions 130 and 140 not only means making them exactly equal, but also may mean making them not exactly equal as long as the present embodiment has the effect of reducing the side wall roughness. Furthermore, making the two pattern portions 130 and 140 have the same temperature not only mean making them have exactly the same temperature, but also may mean making them have not exactly the same temperature as long as the effect of the present embodiment is exhibited.

In addition, when the areas of the entire outer surfaces are equal between both the pattern portions 130 and 140, the amounts of electric charges flowing in during the trench etching can be made equal between both the pattern portions 130 and 140. In other words, according to the second embodiment, as in the first embodiment, the occurrence of a potential difference between both the pattern portions facing each other across the trench 20 can be reduced. In other words, when the areas of the entire outer surfaces are made equal between both the pattern portions 130 and 140, not only the roughness of the side walls 131 and 140 caused by the temperature difference but also the roughness of the side walls 131 and 140 caused by the potential difference can be reduced.

Modification of Second Embodiment

A method of producing a semiconductor device according to a modification of the second embodiment will be described with reference to FIGS. 24 and 25, focusing on differences from the second embodiment. The present modification differs from the above second embodiment in the structure where both the pattern portions 130 and 140 have the same temperature during the trench etching.

Figure 24:
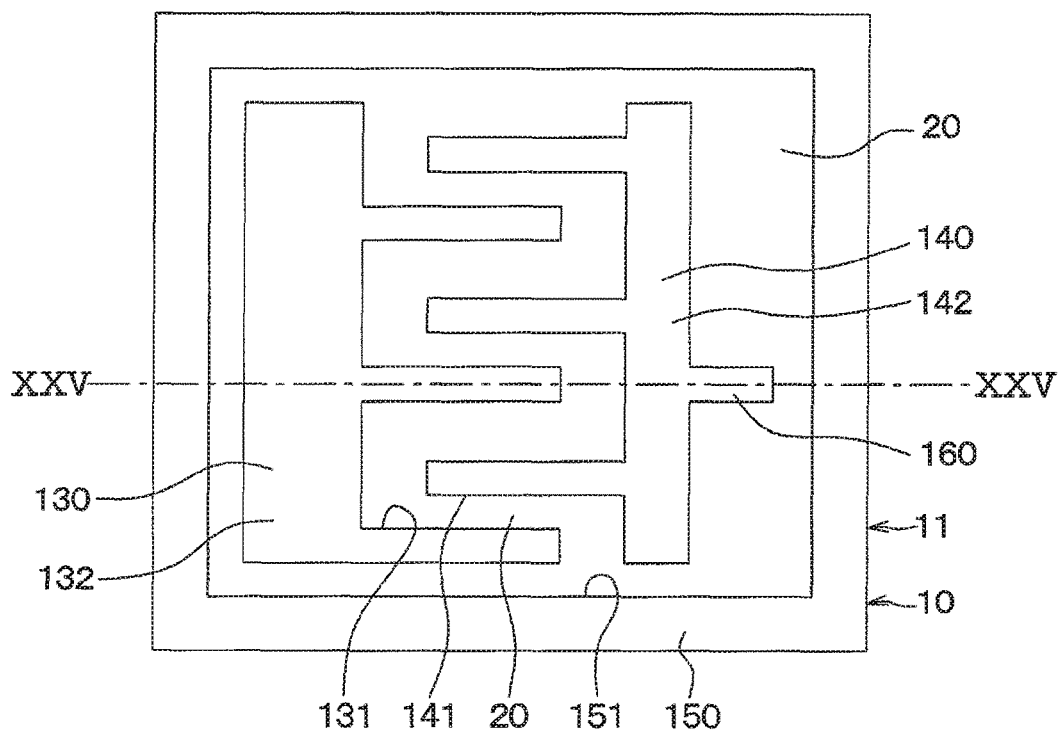
FIG. 24 is a schematic plan view showing a state of the semiconductor device immediately after completion of the trench etching according to a modification of the second embodiment.
Figure 25:
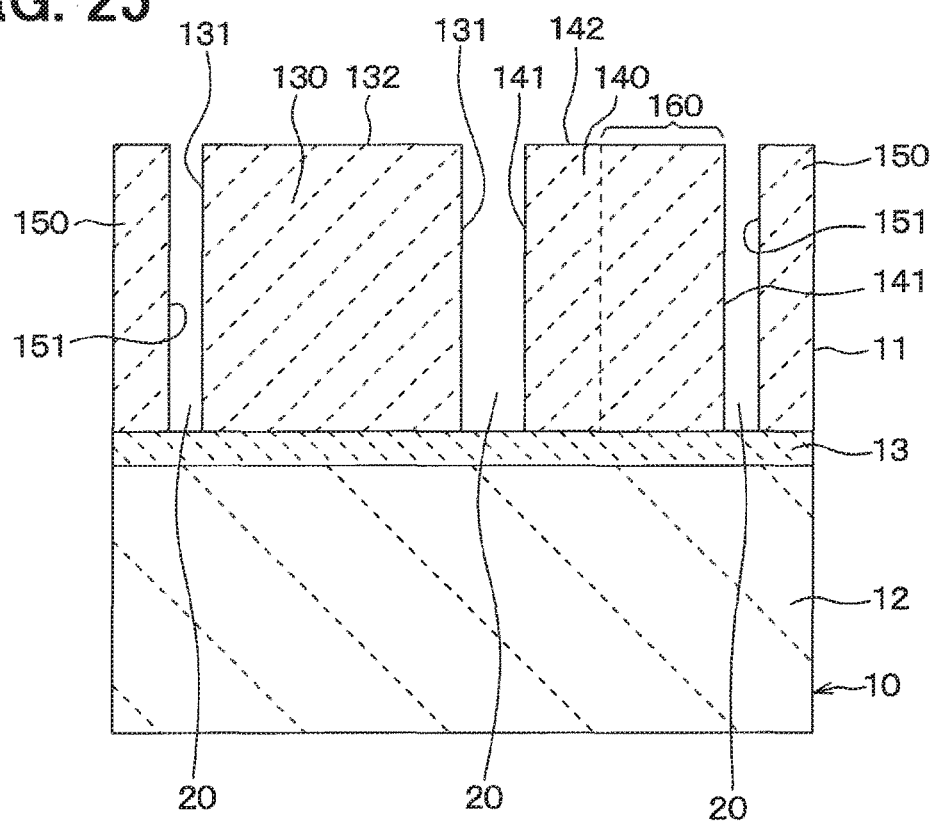
FIG. 25 is a schematic cross-sectional view taken along a dash-dotted line—XXV-XXV in FIG. 24.

As shown in FIGS. 24 and 25, the structure employed in the present modification is a structure having a heat escape portion 160 for releasing heat from the second pattern portion 140, which is provided for the second pattern portion 140 of both the pattern portions 130 and 140.

In the absence of the heat escape portion 160, the second pattern portion 140 is likely to have a higher temperature because the second pattern portion 140 is narrower in width than the first pattern portion 130 as a whole. Therefore, in the present modification, the heat escape portion 160 is provided in the second pattern portion 140 of both the pattern portions 130 and 140. In the illustrated example, the heat escape portion 160 protrudes from a portion of the side wall of the second pattern portion 140, which does not face the side wall of the first pattern portion 130. However, the present modification is not limited to the structure of the above specific illustrated example.

In the present modification, during the trench etching, the heat of the second pattern portion 140 is radiated from the heat escape portion 60 to the etching atmosphere or the insulating film 13. According to the present modification, the temperature of the second pattern portion 140 can be brought closer to the temperature of the first pattern portion 130 by the heat escape portion 160 during the trench etching, so that the temperatures of both the pattern portions 130 and 140 can be easily made equal to each other.

In the example of FIGS. 24 and 25, the heat escape portion 160 is provided in the second pattern portion 140 which is more likely to have a high temperature. However, the shapes of both the pattern portions 130 and 140 are not limited to those in FIGS. 24 and 25. If the first pattern portion 130 side tends to have a high temperature, the heat escape portion 160 may be provided on the first pattern portion 130 side.

In any case, as long as the heat escape portion 160 can exert the effect of reducing the temperature difference between the pattern portions 130 and 140 to achieve the same temperature during the trench etching, the mode of installation of the heat escape portion 160 is not particularly restricted. Therefore, the heat escape portions may be provided on both of the pattern portions 130 and 140.

In other words, if the temperature equalizing effect is exerted as described above, the trench etching may be performed to provide a structure in which the heat escape portion 160 is provided on one or both of the first pattern portion 130 and the second pattern portion 140.

Further, in the above embodiment, as shown in FIGS. 13 and 14, both the pattern portions 130 and 140 are used as the movable electrodes or the fixed electrodes. However, the present disclosure is not limited to the above configuration. For example, both of the pattern portions 130 and 140 may be configured as electrodes for external connection by wire bonding or the like.

In that case, the insulating film 13 may be left as it is in the state shown in FIG. 14, without performing the sacrificial layer etching on the insulating film 13 to provide a configuration in which a part of both the pattern portions 130 and 140 floats from the support silicon layer.

Figure 26:
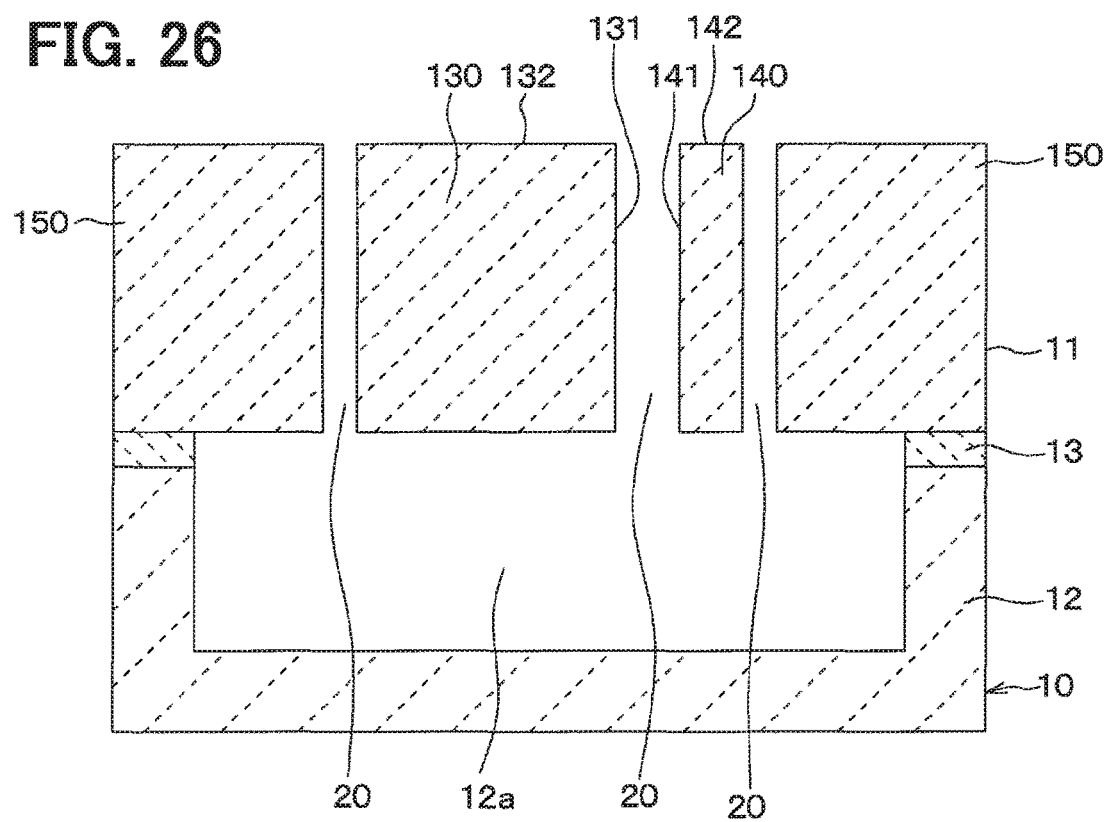
FIG. 26 is a schematic cross-sectional view showing a semiconductor device according to a modification of the second embodiment.

In order to achieve a configuration in which a part of the pattern portions 130 and 140 floats from the support substrate 12, for example, a semiconductor substrate 10 as shown in FIG. 26 may be used. In that case, a cavity 12a is provided in advance in a portion of the support substrate 12 located immediately below the portion to be floated in both the pattern portions 130 and 140.

Such a semiconductor substrate 10 is formed by joining the support substrate 12 having the cavity 12a to the semiconductor layer 11 across the insulating film 13. According to the above configuration, even if the sacrificial layer etching of the insulating film 13 is not performed after the trench etching as described above, the floating portion is formed with completion of the trench etching of the semiconductor layer 11. In other words, the structure shown in FIG. 26 can be used in the second embodiment described above.

In addition, the first pattern portion 130 and the second pattern portion 140 are not limited to those electrically isolated from each other, and may be electrically connected to each other by a portion other than the trench 20.

Other Modifications

The respective embodiments and the representative modifications of those embodiments have been described above. However, the present disclosure is not limited to the respective embodiments and the respective modifications, which are specifically illustrated with reference to the drawings. In other words, the above respective embodiments are not limited to the above specific examples. In addition to the modifications described above, the above embodiments can be appropriately modified. In addition, the above respective embodiments are not irrelevant to each other and can be appropriately combined with each other unless such combination is apparently impossible.

For example, the trench etching may be performed by etching and removing the semiconductor layer 11 while forming the protective film 4 on the surface of the semiconductor layer 11. Therefore, the trench etching is not limited to that including the first step, the second step, and the third step described above, which are repeated in the stated order. Furthermore, it goes without saying that the gas used for etching is not limited to the above-mentioned gas such as $C_4F_8$ or $SF_6$.

In the first embodiment, the semiconductor layer 11 is not limited to that configured as a part of the semiconductor substrate 10 made of the above-described SOI substrate or the like. Needless to say, for example, the semiconductor substrate 10 may be a single layer substrate of only the semiconductor layer 11.

In the second embodiment, the semiconductor substrate 10 is not limited to the above-described SOI substrate. In other words, it goes without saying that the semiconductor substrate 10 is not limited to such a multilayer substrate, but may be a single layer substrate, for example. In addition to the method of forming the protective film by changing the gas, the same effect can be expected also in the etching method in which the etching gas and a raw material gas for the protective film flow at the same time.

Further, the production method described above can be applied, by performing trench etching on a semiconductor layer, to a semiconductor device in which a first pattern portion and a second pattern portion are formed and partitioned through a trench. Therefore, the production method according to the present disclosure is not limited to the application to the acceleration sensor as described above.

The invention claimed is:

1. A semiconductor device production method, comprising:
   performing trench etching to form a trench in a thickness direction of a semiconductor layer so that both of a first pattern portion and a second pattern portion whose side walls face each other across the trench are formed, wherein
   in the trench etching, the semiconductor layer is etched and removed while a protective film is formed on a surface of the semiconductor layer, and
   the trench etching is performed so that the first pattern portion and the second pattern portion are configured to have a same potential during the trench etching,
   the first pattern portion and the second pattern portion are made in a state of having the same potential during the trench etching by performing the trench etching so that the first pattern portion and the second pattern portion, after the trench is formed, are connected to each other by a coupling portion as a portion of the semiconductor layer other than the first and second pattern portions,
   in the trench etching, a semiconductor substrate in which a surface of the semiconductor layer opposite to a surface on a starting side of the trench etching is joined to a support substrate through an insulating film and having a recessed portion is used, and
   the semiconductor substrate has, before the trench etching, the recessed portion in a surface of the semiconductor layer adjacent to the support substrate or in a surface of the support substrate adjacent to the semiconductor layer at a portion of the semiconductor layer corresponding to a trench forming portion of the semiconductor layer so that the semiconductor layer and the support substrate are separated from each other.

2. The semiconductor device production method according to claim 1, wherein:
   the trench etching is performed to further form, in the semiconductor layer, a third pattern portion and a fourth pattern portion whose side walls face each other across the trench and which are electrically isolated from each other after the trench is formed, and
   the trench etching is performed to provide a structure in which a total area of a surface of a trench etching starting side and side walls of the third pattern portion is equal to a total area of a surface of a trench etching starting side and side walls of the fourth pattern portion.

3. The semiconductor device production method according to claim 2, wherein
   the third and fourth pattern portions are subjected to the trench etching in a state where both of a portion of the semiconductor layer configuring the third pattern portion and the semiconductor layer configuring the fourth pattern portion are joined to and supported on the support substrate through the insulating film at a portion other than the trench forming portion, and
   the trench etching is performed in a state where a joint surface area between the third pattern portion and the insulating film is equal to a joint surface area between the fourth pattern portion and the insulating film.

4. The semiconductor device production method according to claim 1, wherein:
   the trench etching is performed to further form, in the semiconductor layer, a third pattern portion and a fourth pattern portion whose side walls face each other across the trench and which are electrically isolated from each other after the trench is formed,
   the third and fourth pattern portions are subjected to the trench etching in a state where both of a portion of the semiconductor layer configuring the third pattern portion and the semiconductor layer configuring the fourth pattern portion are joined to and supported on the support substrate through the insulating film at a portion other than the trench forming portion, and
   the trench etching is performed in a state where a joint surface area between the third pattern portion and the insulating film is equal to a joint surface area between the fourth pattern portion and the insulating film.

5. A semiconductor device production method, comprising performing trench etching to form a trench in a thickness direction of a semiconductor layer so that both of a first pattern portion and a second pattern portion whose side walls face each other across the trench are formed, wherein:

in the trench etching, the semiconductor layer is etched and removed while a protective film is formed on a surface of the semiconductor layer, the trench etching is performed so that the first pattern portion and the second pattern portion are configured to have a same potential or a same temperature during the trench etching, the trench etching is performed to form the first pattern portion and the second pattern portion so that the first pattern portion and the second pattern portion are electrically isolated from each other after the trench is formed, and the trench etching is performed to provide a structure in which a total area of a surface of a trench etching starting side and side walls of the first pattern portion is equal to a total area of a surface of a trench etching starting side and side walls of the second pattern portion.

6. A semiconductor device production method, comprising performing trench etching to form a trench in a thickness direction of a semiconductor layer so that both of a first pattern portion and a second pattern portion whose side walls face each other across the trench are formed, wherein:

in the trench etching, the semiconductor layer is etched and removed while a protective film is formed on a surface of the semiconductor layer, the trench etching is performed so that the first pattern portion and the second pattern portion are configured to have a same potential or a same temperature during the trench etching, the trench etching is performed to form the first pattern portion and the second pattern portion so that the first pattern portion and the second pattern portion are electrically isolated from each other after the trench is formed, and the first and second pattern portions are subjected to the trench etching in a state where both of a portion of the semiconductor layer configuring the first pattern portion and the semiconductor layer configuring the second pattern portion are joined to and supported on a support substrate through an insulating film at a portion other than a trench forming portion, and the trench etching is performed in a state where a joint surface area between the first pattern portion and the insulating film is equal to a joint surface area between the second pattern portion and the insulating film.

7. A semiconductor device production method comprising performing trench etching to form a trench in a thickness direction of a semiconductor layer so that both of a first pattern portion and a second pattern portion whose side walls face each other across the trench are formed, wherein:

in the trench etching, the semiconductor layer is etched and removed while a protective film is formed on a surface of the semiconductor layer, the trench etching is performed so that the first pattern portion and the second pattern portion are configured to have a same temperature during the trench etching, and the trench etching is performed to provide a structure in which at least one of the first pattern portion and the second pattern portion has a heat escape portion that releases heat from the at least one pattern portion, so that both of the first pattern portion and the second pattern portion have the same temperature during the trench etching.

* * * * *

UNITED STATES PATENT AND TRADEMARK OFFICE
CERTIFICATE OF CORRECTION

PATENT NO. : 10,479,675 B2  
APPLICATION NO. : 15/757672  
DATED : November 19, 2019  
INVENTOR(S) : Akira Ogawa et al.

Page 1 of 1

It is certified that error appears in the above-identified patent and that said Letters Patent is hereby corrected as shown below:

On the Title Page

Item (30), correct the Foreign Application Priority Data:  
"Nov. 27, 2015 (JP) .................... 2015-232037"  
To:  
-- Nov. 27, 2015 (JP) .................. 2015-232037  
Sep. 30, 2015 (JP) ...................... 2015-194499 --

Signed and Sealed this  
Third Day of March, 2020

Andrei Iancu  
*Director of the United States Patent and Trademark Office*